(12) United States Patent
Yun

(10) Patent No.: US 8,767,462 B2
(45) Date of Patent: Jul. 1, 2014

(54) NONVOLATILE MEMORY DEVICE

(75) Inventor: Jae-Sun Yun, Anyang-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 514 days.

(21) Appl. No.: 13/070,319

(22) Filed: Mar. 23, 2011

(65) Prior Publication Data

US 2011/0249497 A1   Oct. 13, 2011

(30) Foreign Application Priority Data

Apr. 12, 2010   (KR) .................. 10-2010-0033419

(51) Int. Cl.
*G11C 16/04* (2006.01)
*H01L 27/115* (2006.01)

(52) U.S. Cl.
USPC ............. 365/185.05; 365/185.17; 257/314; 257/315; 257/316; 257/773; 257/776

(58) Field of Classification Search
CPC ........... H01L 27/115; H01L 27/11563; H01L 27/11565; H01L 27/11573; H01L 27/11575; H01L 27/11578
USPC .......... 365/185.5, 185.17; 257/314–316, 773, 257/776
See application file for complete search history.

(56) References Cited

U.S. PATENT DOCUMENTS

| | | | | |
|---|---|---|---|---|
| 6,738,290 B2* | 5/2004 | Lee et al. | ................ | 365/185.17 |
| 6,925,008 B2* | 8/2005 | Ichige et al. | ............ | 365/185.17 |
| 7,646,664 B2* | 1/2010 | Cho et al. | ................ | 365/230.06 |
| 2013/0058166 A1* | 3/2013 | Maejima | .................. | 365/185.18 |
| 2013/0135931 A1* | 5/2013 | Namai | ..................... | 365/185.11 |

FOREIGN PATENT DOCUMENTS

| | | |
|---|---|---|
| KR | 10-0205785 B1 | 1/1999 |
| KR | 10-2001-0055368 A | 7/2001 |
| KR | 10-2003-0060313 A | 7/2003 |
| KR | 10-2006-0097880 A | 9/2006 |

* cited by examiner

*Primary Examiner* — Allison P Bernstein
(74) *Attorney, Agent, or Firm* — Muir Patent Consulting, PLLC

(57) ABSTRACT

The nonvolatile memory device may include a substrate including a first region and a second region. A string line group may be disposed on the substrate in the first region, and a bias interconnection group may be disposed above the substrate in the second region. The bias interconnection group may include a string select bias interconnection, cell bias interconnections, and a ground select bias interconnection, which may be respectively electrically connected to a string select line, word lines, and a ground select line of the string line group. The string select bias interconnection may be disposed between the ground select bias interconnection and the cell bias interconnections of the bias interconnection group.

20 Claims, 17 Drawing Sheets

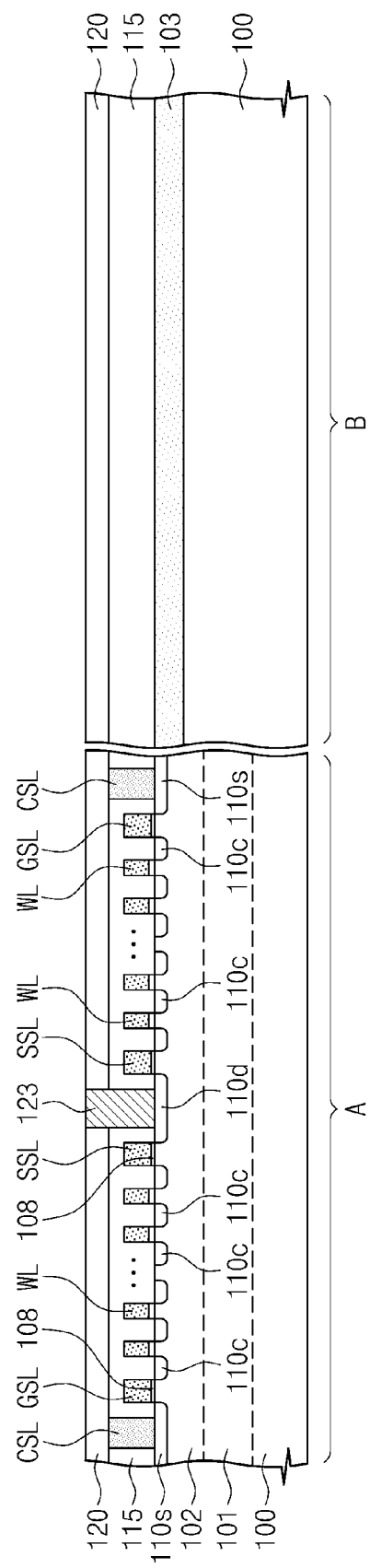

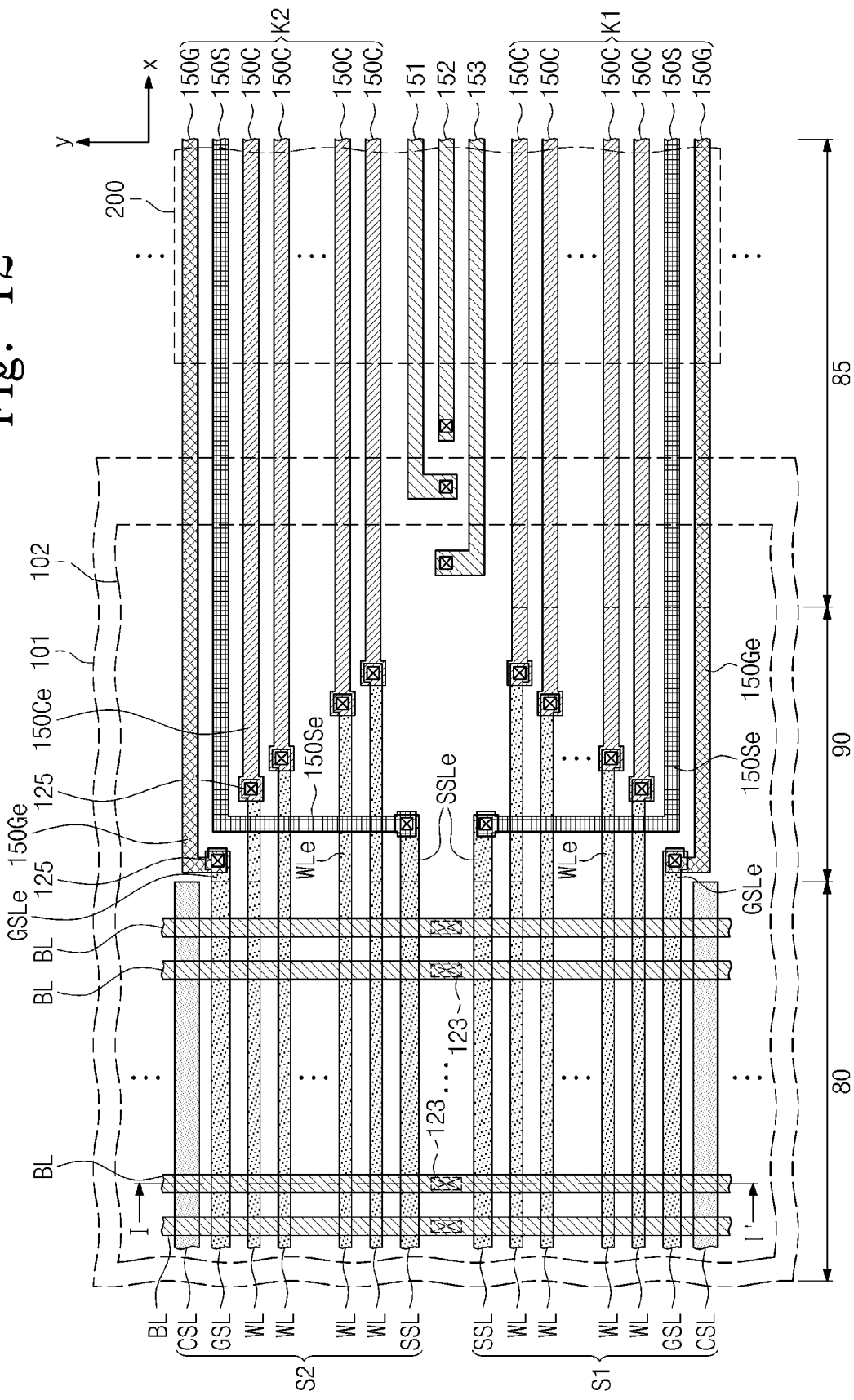

NONVOLATILE MEMORY DEVICE

CROSS-REFERENCE TO RELATED APPLICATIONS

This U.S. non-provisional patent application claims priority under 35 U.S.C. §119 from Korean Patent Application No. 10-2010-0033419, filed in the Korean Intellectual Property Office on Apr. 12, 2010, the entire contents of which are hereby incorporated by reference.

BACKGROUND

The present disclosure herein relates to semiconductor devices, and more particularly, to nonvolatile memory devices.

Semiconductor memory devices may be classified into volatile memory devices and nonvolatile memory devices. The volatile memory devices have a volatile characteristic that loses all data stored therein when power is cut off. The volatile memory devices may include DRAM devices and SRAM devices. Nonvolatile memory devices have a characteristic that it retains stored data even if power supply is interrupted. Examples of the nonvolatile memory devices may include PRAM devices, MRAM devices and/or flash memory devices.

Flash memory devices may electrically rewrite or erase data. Such a flash memory device may be classified as a NOR type flash memory device or a NAND type flash memory device. The NOR type flash memory device enables high-speed random access, and thus, it may be widely used for a device in which high-speed operation is required. The NAND type flash memory device has faster programming and erasing speed and advantage of easy high integration. Thus, the NAND type flash memory may be used for a large-capacity memory device.

As the semiconductor industries are developed rapidly, line widths and/or distances of patterns for realizing nonvolatile memory devices are being reduced more and more. Accordingly, reliability of the nonvolatile memory devices is being reduced. As semiconductor and electronic industries develop, high-integration and superior reliability of nonvolatile memory devices are being required more and more.

SUMMARY

The present disclosure provides a nonvolatile memory device having superior reliability.

The present disclosure also provides a nonvolatile memory device having optimized high-integration.

Embodiments disclosed herein provide nonvolatile memory devices including: a substrate including a first region and a second region, which are spaced from each other; a string line group disposed on the substrate in the first region, the string line group including a string select line, word lines, and a ground select line; and a bias interconnection group disposed above the substrate in the second region, the bias interconnection group including a string select bias interconnection, cell bias interconnections, and a ground select bias interconnection, which are respectively electrically connected to the string select line, the word lines, and the ground select line within the string line group. The string select bias interconnection is disposed between the ground select bias interconnection and the cell bias interconnections within the bias interconnection group.

In some embodiments, the bias interconnections within the bias interconnection group may be disposed at positions higher than those of the lines within the string line group from a top surface of the substrate.

In other embodiments, the ground select, string select, and cell bias interconnections may be disposed on the same level as each other from a top surface of the substrate.

In still other embodiments, the sting select, cell, and ground select bias interconnections may extend parallel to each other in a first direction parallel to a top surface of the substrate, and the string select line, the word lines and the ground select line may extend parallel to each other in the first direction.

In even other embodiments, the word lines may be disposed between the string select line and the ground select line within the string line group.

In yet other embodiments, the ground select bias interconnection, the string select bias interconnection, and the cell bias interconnections may be disposed at the same interval therebetween.

In further embodiments, the nonvolatile memory devices may further include: at least one interlayer dielectric covering the lines within the string line group, the at least one interlayer dielectric being disposed on an entire surface of the substrate; and bit lines disposed on the interlayer dielectric in the first region, the bit lines extending parallel to each other in a second direction perpendicular to the first direction.

In still further embodiments, the ground select, string select, and cell bias interconnections may be disposed on the same level as those of the bit lines from the top surface of the substrate.

In even further embodiments, the ground select, string select, and cell bias interconnections may be disposed on levels different from those of the bit lines from the top surface of the substrate.

In yet further embodiments, the nonvolatile memory devices may further include: a source region defined in the substrate at a side of the ground select line; a common source line connected to the string source region, the common source line extending in the first direction; and a string drain region defined in the substrate at a side of the string select line. The at least one interlayer dielectric may include a first interlayer dielectric and a second interlayer dielectric, which are sequentially stacked, and the second interlayer dielectric covers a top surface of the common source line. The bit line may be disposed on the second interlayer dielectric and electrically connected to the string drain region by a contact plug sequentially passing through the second and first interlayer dielectrics.

In yet further embodiments, the substrate may further include a third region defined between the first region and the second region. In this case, each of the lines within the string line group may include an extension part extending into the third region, and each of the bias interconnections within the bias interconnection group may include an extension part extending into the third region. The extension parts of the lines and the bias interconnections, which are electrically connected to each other, may partially overlap each other, and the overlapping extension parts may be electrically connected to each other by a contact plug disposed therebetween.

In yet further embodiments, the string line group may be provided in plurality within the first region, and the bias interconnection group may be provided in plurality within the second region. The ground select, string select, and cell bias interconnections may extend parallel to each other in a first direction, and the string select, word, and ground select lines may extend parallel to each other in the first direction. The string line groups may be mirror-symmetrically arranged in a second direction perpendicular to the first direction, and the bias interconnection groups may be mirror-symmetrically arranged in the second direction.

In yet further embodiments, the plurality of bias interconnection groups may include a pair of bias interconnection groups adjacent to each other, and a pair of ground select bias interconnections respectively included in the pair of bias interconnection groups may be disposed between a pair of string select bias interconnections respectively included in the pair of bias interconnections.

In yet further embodiments, the nonvolatile memory devices may further include: a deep well region formed in the first region of the substrate; a pocket well region formed in the deep well region; a first pick-up bias interconnection disposed between the pair of ground select bias interconnections, the first pick-up bias interconnection being electrically connected to the deep well region; a second pick-up bias interconnection disposed between the pair of ground select bias interconnections, the second pick-up line being electrically connected to the pocket well region; and a third pick-up bias interconnection disposed between the pair of ground select bias interconnections, the third pick-up line being electrically connected to the substrate.

In yet further embodiments, the first, second, and third pick-up bias interconnections may be disposed on the same level as those of the bias interconnections within the pair of bias interconnection groups, and the first, second, and third pick-up bias interconnections and the bias interconnections within the pair of bias interconnection groups may be disposed at the same interval therebetween.

In yet further embodiments, the bias interconnections within the pair of bias interconnection groups may be disposed at the same interval therebetween.

BRIEF DESCRIPTION OF THE DRAWINGS

The accompanying drawings are included to provide a further understanding of the examples described herein, and are incorporated in and constitute a part of this specification. The drawings illustrate exemplary embodiments and, together with the description, serve to explain principles of these embodiments. In the drawings:

FIGS. 5A and 6A are sectional views taken along line I-I' and II-II' of FIG. 1 so as to explain a method of forming a nonvolatile memory device according to an embodiment;

FIG. 12 is a plan view of a nonvolatile memory device according to an embodiment.

DETAILED DESCRIPTION OF THE EMBODIMENTS

Figure 1:
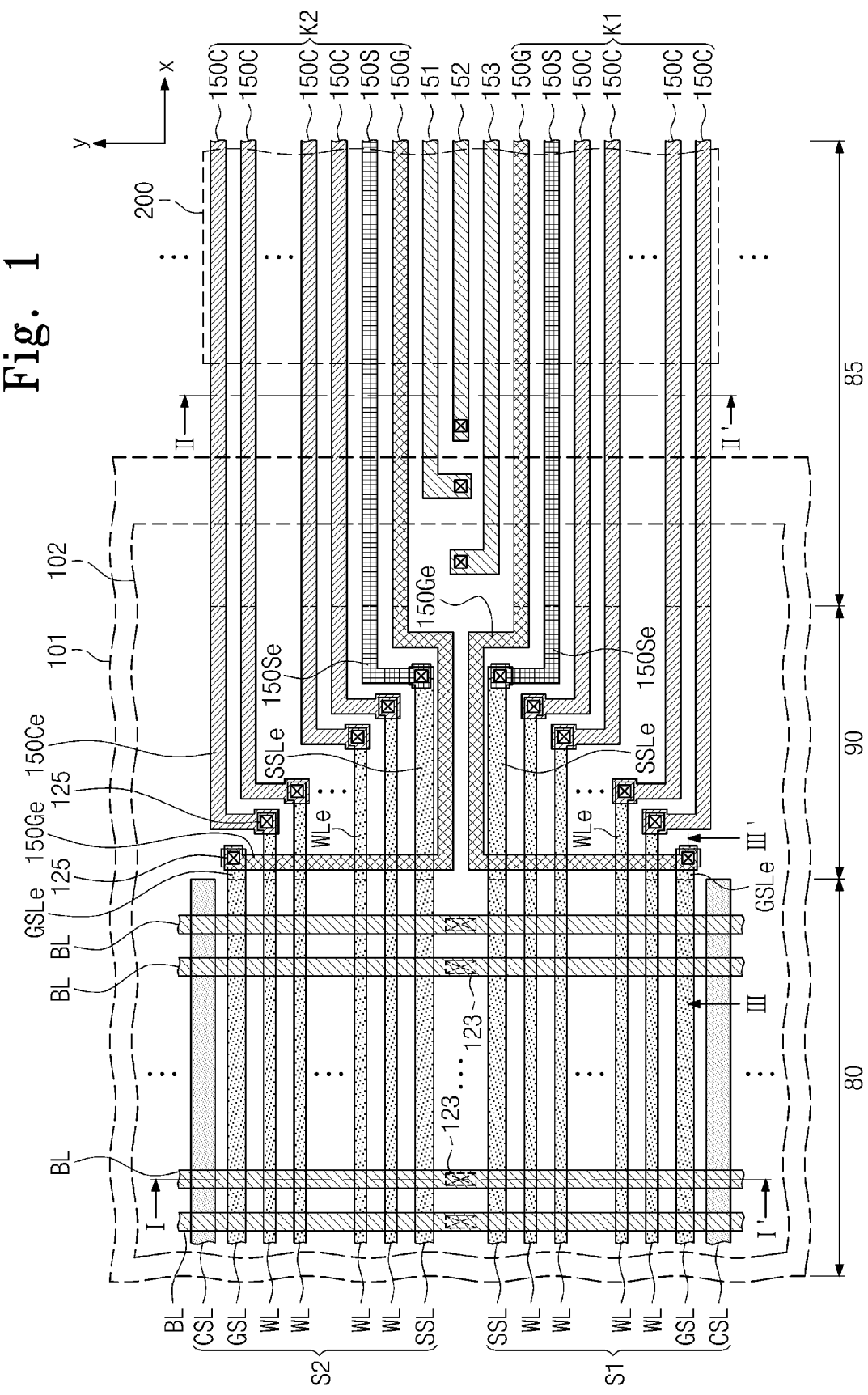
FIG. 1 is a plan view of a nonvolatile memory device according to an embodiment.

Exemplary embodiments will be described below in more detail with reference to the accompanying drawings. The technology may, however, be embodied in different forms and should not be construed as limited to the embodiments set forth herein. Modifications may be made to the disclosed embodiments without departing from the spirit and scope of the invention set forth in the claims below.

In the drawings, the dimensions of layers and regions may be exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, or one or more intervening layers may also be present. In addition, it will also be understood that when a layer is referred to as being 'between' two layers, it can be the only layer between the two layers (e.g. "directly between"), or one or more intervening layers may also be present. Also, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "adjacent" versus "directly adjacent," etc.).

Like reference numerals refer to like elements throughout.

Shapes of the exemplary views may be modified according to manufacturing techniques and/or allowable errors. Therefore, the embodiments are not limited to the specific shapes illustrated in the exemplary views, but may include other shapes that may be created according to manufacturing processes. For example, a right-angled etched area may have a rounded shape or a certain curvature. Areas exemplified in the drawings have general properties, and are used to illustrate a shape of a device region. However other shapes and areas are possible such that the illustrated shapes and areas should not be construed as limitations. Also, though terms like a first, a second, and the like are used to describe various components in various embodiments, the components are not limited to these terms. These terms are used only to discriminate one component from another component. Embodiments described and exemplified herein include complementary embodiments thereof.

In the following description, the technical terms are used only for explaining a specific exemplary embodiment and are not intended to be limitations. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

First Embodiment

Figure 2A:
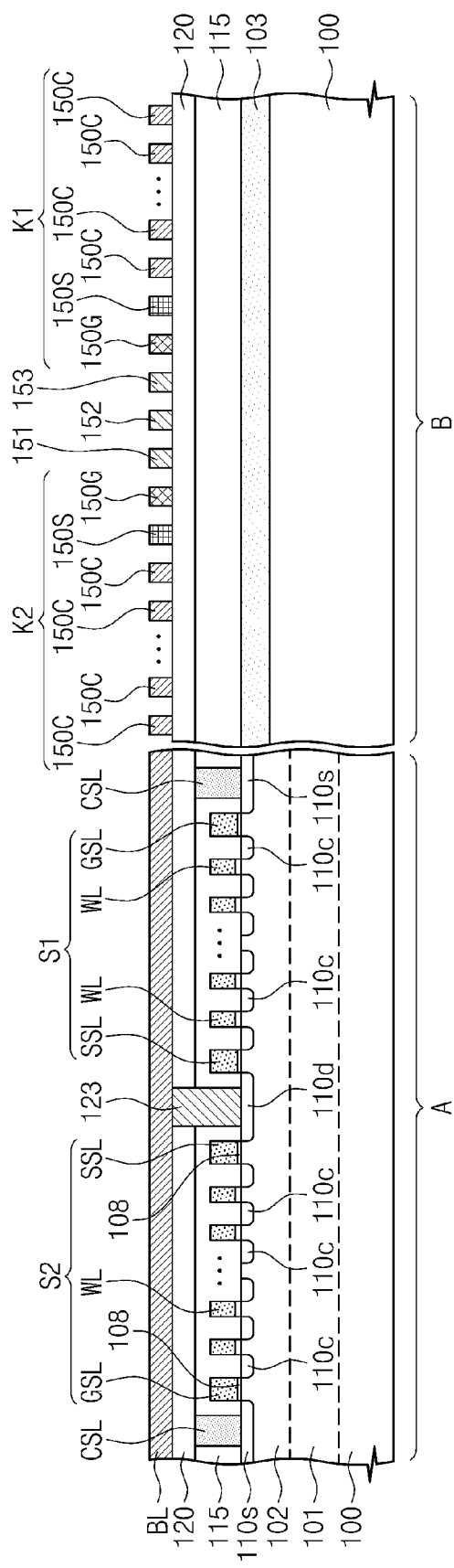
FIG. 2A is a sectional view taken along line I-I' and II-II' of FIG. 1.
Figure 2B:
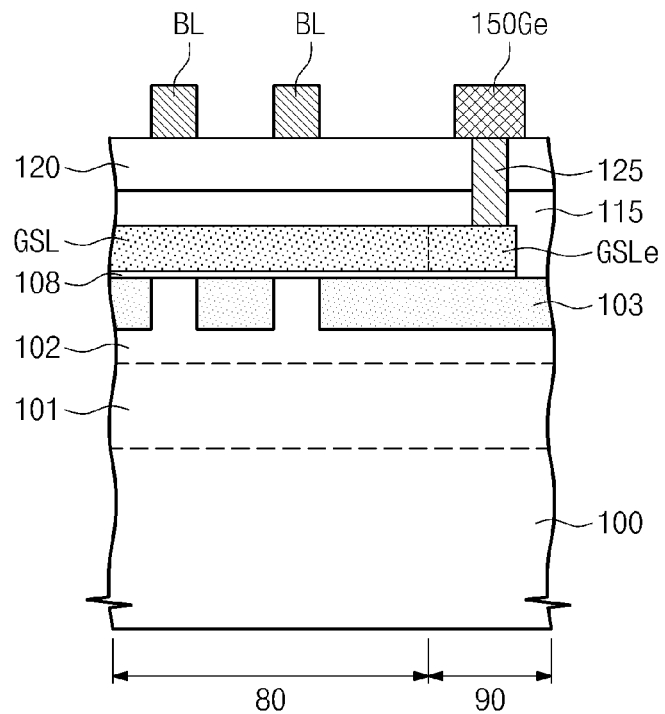
FIG. 2B is a sectional view taken along line III-III' of FIG. 1.

FIG. 1 is a plan view of a nonvolatile memory device according to an embodiment, FIG. 2A is a sectional view taken along line I-I' and II-II' of FIG. 1, and FIG. 2B is a sectional view taken along line III-III' of FIG. 1. A reference numeral A of FIG. 2A illustrates a sectional view taken along line I-I' of the FIG. 1, and a reference numeral B illustrates a sectional view taken along line II-II' of FIG. 1. For convenience of description, FIG. 2B is an enlarged sectional view taken along line III-III' of FIG. 1.

Referring to FIGS. 1, 2A, and 2B, a semiconductor substrate (hereinafter, referred to as a "substrate") 100 may include a first region 80, a second region 85, and a third region 90. As shown in FIG. 1, the first region 80 may be spaced from the second region 85, and the third region 90 may be disposed between the first region 80 and the second region 85. The first region 80 may be a cell array region in which a plurality of memory cells is disposed. The second region 85 may be a portion of a peripheral circuit region. For example, the second region 85 may be a decoder region in which decoders connected to word lines are disposed. The decoder (not shown) may be a row decoder responsive to address signals to perform reading or writing (e.g., programming) of memory cells connected to a selected word line. When the cells are memory transistor cells of a NAND flash memory, a page of cells may be read or programmed in accordance with the addressing of the row decoder. The row decoder may also be responsible for the appropriate activation of the ground select line GSL and string select line SSL. The third region 90 may be a connection region for electrically connecting lines (that will be described later) of the first region 80 and interconnections (that will be described later) of the second region 85 to each other. The substrate 100 may be a silicon substrate, a germanium substrate, or silicon-germanium substrate. The substrate 100 may be doped with a first type dopant.

A deep well region 101 doped with a second type dopant may be disposed within the first region 80 of the substrate 100. The deep well region 101 may laterally extend inside the third region 90 and the second region 85. A pocket well region 102 doped with the first type dopant may be disposed within the deep well region 101. Also, the pocket well region 102 may laterally extend inside the third region 90 and the second region 85. Any one of the first type dopant and the second type dopant may be an N-type dopant, and the other may be a P-type dopant. According to an embodiment, the first type dopant may be the P-type dopant, and the second type dopant may be the N-type dopant.

A device isolation pattern 103 may be disposed within substrate 100. The device isolation pattern 103 may be a field isolation, such as a field oxide, or trench isolation. The device isolation pattern 103 may define string active regions within the first region 80. The respective string active regions may be a portion of the substrate 100 including the pocket well region 102 surrounded by the device isolation pattern 103 or otherwise having an area defined by the device isolation pattern 103. Thus, the string active regions are doped with the first type dopant. The pocket well region 102 has a bottom surface lower than that of the device isolation pattern 103, and the deep well region 101 has a bottom surface lower than that of the pocket well region 102.

The string active regions may be spaced from each other in a first direction. The string active regions may have line shapes extending in a parallel fashion along a second direction perpendicular to the first direction. The first and second directions are parallel to a top surface of the substrate 100. The first direction may be an X-axis direction of FIG. 1, and the second direction may be a Y-axis direction of FIG. 1. Like the cut lines I-I' and II-II' of FIG. 1, sectional views A and B of FIG. 2A are sectional views taken along the second direction (e.g., the Y-axis direction). Like the cut line III-III' of FIG. 1, a sectional view of FIG. 2B is a sectional view taken along the first direction. That is, FIG. 2B illustrates a view in which the string active regions are spaced from each other in the first direction, and FIG. 2A illustrates a sectional view taken in a longitudinal direction (i.e., the second direction or the Y-axis direction) of the string active regions. Referring to FIG. 1, the string active regions may substantially and completely overlap bit lines BL, respectively. The bit lines BL may substantially and completely cover the string active regions. Thus, in FIG. 1, the string active regions are completely covered by the bit lines BL. According to an embodiment, the device isolation pattern 103 disposed within the second region 85 may define driving active regions (not shown) in which driving transistors are disposed.

A plurality of string line groups may be disposed in the first region 80 of the substrate 100. Each of the string line groups may include one string select line SSL, a plurality of word lines WL, and one ground select line GSL. The string select line SSL, the word lines WL, and the ground select line GSL may extend in the first direction. The plurality of word lines WL are disposed between the string select line SSL and the ground select line GSL within the respective string line groups. The plurality of string line groups may be arranged in the second direction. The plurality of string line groups may be mirror-symmetrically and repeatedly arranged in the second direction.

The plurality of string line groups may include a pair of string line groups S1 and S2 adjacent to each other. The pair of string line groups S1 and S2 may be mirror-symmetrically arranged with respect to each other. For example, the first string line group S1 may be symmetric to the second string line group S2 with respect to a virtual line passing between the pair of string line groups S1 and S2 and extending in the first direction. The string select line SSL of the lines SSL, WL, and GSL of the first string line group S1 may be disposed most adjacent to the second string line group S2. The string select line SSL of the lines SSL, WL, and GSL of the second string line group S2 may be disposed most adjacent to the first string line group S1.

The string select line SSL, the word lines WL, and the ground select line GSL cross the plurality of string active regions in a parallel fashion extending in the second direction. Here, the lines SSL, WL, and GSL are insulated from the string active regions. For example, a gate dielectric 108 may be disposed between the string select line SSL and the string active region and between the ground select line GSL and the string active region. A multi-layer may be disposed between the word line WL and the string active region. The multi-layer between the word line WL and the string active region will be described later in detail.

A plurality of cell strings may be formed by string line groups S1 and S2 overlapping respective string active regions. A plurality of cell strings may be 2-dimensionally arranged on the first region 80 of the substrate 100 along the first and second directions. Each of the cell strings may include a plurality of cell transistors connected to each other in series, a string select transistor connected to one end of the plurality of cell transistors in series, and a ground select transistor connected to the other end of the plurality of cell transistors in series. The string select line SSL may include a gate of the string select transistor. The ground select line GSL may include a gate of the ground select transistor. The word line WL may include a gate of the cell transistor. Further details of exemplary cell string structure, and their connections, layout and operation thereof, may be found in U.S. Pat. No. 5,473,563, the contents of which are hereby incorporated by reference.

Sectional view A of FIG. 2A illustrates cross sections of a cell string of string line group S1 and a cell string of string line group S2. Each cell string includes a group of serially connected unit cells interposed between a ground select transistor and a string select transistor. In this example, the ground select transistor includes a gate formed of part of the ground select line GSL, a gate dielectric 108 (e.g., a gate oxide) interposed between the gate and substrate 100. The gate of the ground select transistor is interposed between a source and drain of the ground select transistor; the source comprises a string source region 110s and the drain comprises an adjacent cell source/drain region 110c. In this example, the string select transistor includes a gate formed of part of the string select line SSL, a gate dielectric 108 (e.g., a gate oxide) interposed between this gate and substrate 100. The gate of the source select transistor is interposed between a source and drain of the source select transistor; this drain comprises a string drain region 110d and the source comprises an adjacent cell source/drain region 110c. As shown in FIG. 2A, a string source region 110s may be disposed within the string active region defined at a side of the ground select line GSL, and a string drain region 110d may be disposed within the string active region defined at a side of the string select line SSL. A cell source/drain 110c may be defined within the cell string active region adjacent to both sides of the respective word lines WL. The string source region 110s and the string drain region 110d may be regions doped with the second type dopant. According to an embodiment, the cell source/drain 110c may be a region doped with the second type dopant. On the other hand, according to another embodiment, the cell source/drain 110c may be defined as an inversion layer generated by an operation voltage supplied into the word lines WL.

The string drain region 110d may be disposed between a pair of the string select lines SSL respectively included in the pair of string line groups S1 and S2 of FIG. 1. That is to say, a pair of cell strings respectively including the pair of string line groups S1 and S2 may share the string drain region 110d. Similarly, the string source region 110s may be shared by two cell strings adjacent to each other with the string source region 110s therebetween.

As shown in FIG. 1, the string select line SSL and the ground select line GSL may cross the plurality of string active regions arranged in the first direction. Thus, the plurality of string drain regions 110d may be disposed within the plurality of string active regions arranged in the first direction, respectively. Also, the plurality of string source regions 110s may be disposed within the plurality of string active regions arranged in the first direction, respectively.

Figure 2C:
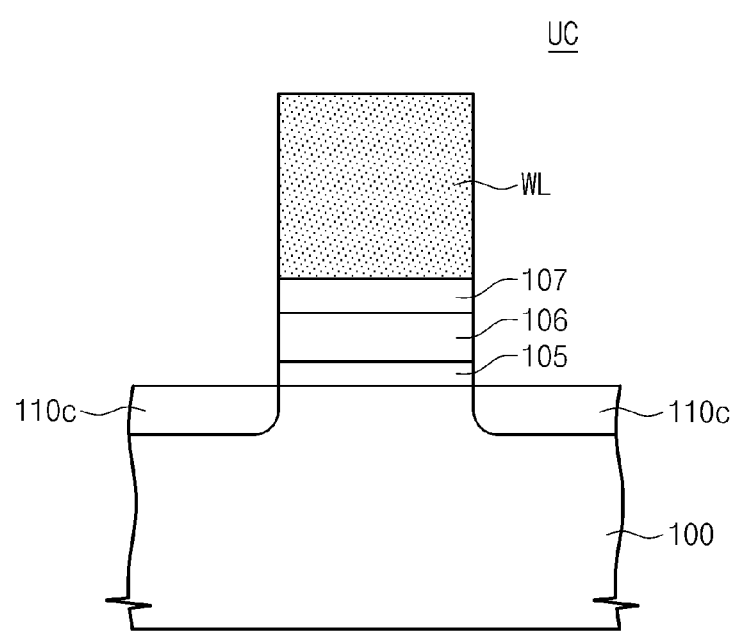
FIG. 2C is an enlarged sectional view illustrating a cell transistor of FIG. 2A.

The above-described cell transistor is illustrated in FIG. 2C. FIG. 2C is an enlarged sectional view illustrating the cell transistor of FIG. 2A.

FIG. 2C shows exemplary structure of a unit cell UC of a cell string, which may be in the form of a memory cell transistor. As described above the cell source/drain 110c may be defined within the string active region adjacent to both sides of the word line WL. A charge storage layer 106 may be disposed between the word line WL and the string active region. A tunnel dielectric 105 is disposed between the charge storage layer 106 and the string active region. A blocking dielectric 107 is disposed between the word line WL and the charge storage layer 106. According to an embodiment, the charge storage layer 106 may include a trap dielectric deep level traps in which charge is stored. For example, the charge storage layer 106 may include at least one of a silicon oxide layer and a metal oxide layer (e.g., hafnium oxide layer). On the other hand, according to an embodiment, the charge storage layer 106 may be formed of group 4A elements (or group 14 elements). When the charge storage layer 106 is formed of group 4A elements (or group 14 elements), the charge storage layer 106 may be in a state doped with dopant or an undoped state. When the charge storage layer 106 is formed of doped group 4A elements (or group 14 elements), the charge storage layer 106 may be doped with dopant (i.e., the second type dopant) different from that of the string active region defined below the word line WL. For example, the string active region defined below the word line WL may be doped with the P-type dopant, and the charge storage layer 106 may be doped with the N-type dopant. On the other hand, when the charge storage layer 106 is formed of doped group 4A elements (or group 14 elements), the charge storage layer 106 may be doped with the same dopant as that (i.e., the first type dopant) of the string active region defined below the word line WL. For example, the string active region defined below the word line WL and the charge storage layer 106 may be doped with the P-type dopant. The charge storage layer 106 may be a floating gate, and may be formed of a conductive material, such as polysilicon.

The tunnel dielectric 105 may be a single layer or a multi-layer. For example, the tunnel dielectric 105 may include an oxide layer, a nitride layer, and/or an oxide nitride layer. The blocking dielectric 107 may include at least one of an oxide layer, a nitride layer, and a high-k dielectric. The high-k dielectric may be a dielectric having a dielectric constant greater than that of the tunnel dielectric 105. For example, the high-k dielectric may include a metal oxide layer such as a hafnium oxide layer and an aluminum oxide layer). The blocking dielectric 107 may be a single layer or a multi-layer.

Continuously, Referring to FIGS. 1, 2A, and 2B, the lines SSL, WL, and GSL are formed of conductive materials, respectively. For example, the lines SSL, WL, and GSL may be formed of at least one of doped group 4A elements (or doped group 14 elements), metals (e.g., titanium, tantalum, tungsten, etc), conductive metal nitrides (e.g., titanium nitride, tantalum nitride, etc), conductive metal-group 4A (group 14) element compounds (e.g., tungsten silicide, cobalt silicide, etc).

The lines SSL, WL, and GSL may include extension parts SSLe, WLe, and GSLe laterally extending into the third region 90, respectively. The extension parts SSLe, WLe, and GSLe are disposed on the same level as those of the lines SSL, WL, and GSL with respect to the top surface of the substrate 100. The extension parts SSLe, WLe, and GSLe are spaced from each other. According to an embodiment, the extension parts SSLe, WLe, and GSLe may have lengths different from each other in the first direction. For example, the extension part SSLe of the string select line SSL among the extension parts SSLe, WLe, and GSLe may have the longest length, and the extension part GSLe of the string select line GSL may have the shortest length. The respective extension parts WLe of the word lines WL may have a length gradually decreasing from the extension part SSLe of the string select line SSL toward the extension part GSLe of the ground select line GSL. However, other embodiments are possible. The extension parts SSLe, WLe, and GSLe may have various lengths, respectively.

As shown in FIG. 1, a driving transistor region 200 may be defined in the second region 85. A driving transistor pair may be disposed within the driving transistor region 200. The driving transistor pair will be described with reference to FIG. 3.

Figure 3:
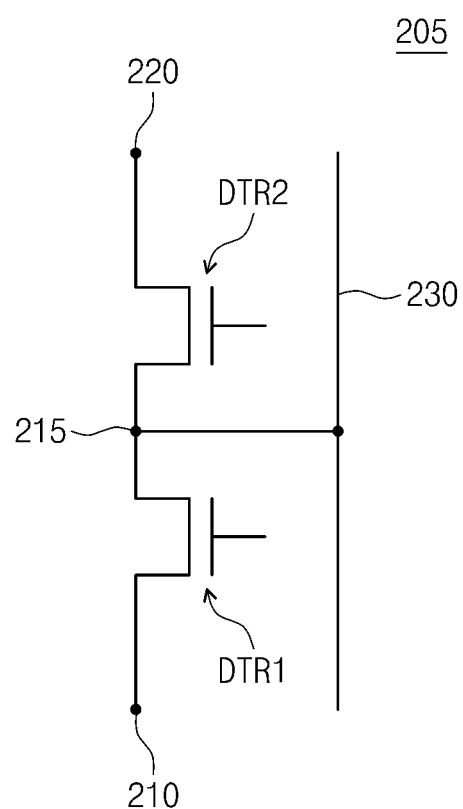
FIG. 3 is an equivalent circuit view of a driving transistor disposed within a driving transistor region of FIG. 1.

FIG. 3 is an equivalent circuit view of a driving transistor disposed within a driving transistor region 200 of FIG. 1.

Referring to FIGS. 1 and 3, the driving transistor pair 205 includes a first driving transistor DTR1 and a second driving transistor DTR2, which are connected to each other in series. A first source/drain of the first driving transistor DTR1 is connected to a first source/drain of the second driving transistor DTR2 to form a node 215. A signal line 230 is connected to the node 215. The first and second driving transistors DTR1 and DTR2 share the signal line 230. A second source/drain 210 of the first driving transistor DTR1 is electrically connected to one of the lines SSL, WL, and GSL within the first string line group S1, and a second source/drain 220 of the second driving transistor DTR2 is electrically connected to one of the lines SSL, WL, and GSL within the second string line group S2. Here, a pair of lines within the first and second string line groups S1 and S2 electrically connected to the first and second driving transistors DTR1 and DTR2 performs the same function as each other. That is to say, the first and second driving transistors DTR1 and DTR2 may share the signal line 230, and thus, the lines electrically connected to the first and second driving transistors DTR1 and DTR2 may perform the same operation as each other. For example, when the second source/drain 210 of the first driving transistor DTR1 is electrically connected to the string select line SSL within the first string line group S1, the second source/drain 220 of the second driving transistor DTR2 is electrically connected to the string select line SSL within the second string line group S2.

When the cell string including the first string line group S1 operates, a turn-off voltage may be applied to the gate of the second driving transistor DTR2 and a turn-on voltage may be applied to the gate of the first driving transistor DTR1 to provide an operation bias of the signal line 230 to the lines within the first string line group S2. On the other hand, when the cell string including the second string line group S2 operates, the turn-off voltage may be applied to the gate of the first driving transistor DTR1 and the turn-on voltage may be applied to the gate of the second driving transistor DTR2 to provide the operation bias of the signal line 230 to the lines within the second string line group S2. The first and second transistors DTR1 and DTR2 may be high-voltage transistors that control a high voltage than a power source voltage. The first and second driving transistors DTR1 and DTR2 may be disposed on the same level as those of the lines SSL, WL, and GSL.

The driving transistor pair 205 may be provided in plurality within the driving transistor region 200. The number of the driving transistor pairs 205 within the driving transistor region 200 may be equal to that of the lines SSL, WL, and GSL within the first string line group S1. That is to say, the first driving transistors DTR1 of the plurality of driving transistor pairs 205 may be electrically connected to the lines SSL, WL, and GSL within the first string line group S1, respectively. Also, the second driving transistors DTR2 of the plurality of driving transistor pairs 205 may be electrically connected to the lines SSL, WL, and GSL within the second string line group S2. According to an embodiment, the plurality of driving transistor pairs 205 may be arranged within the driving transistor region 200 in the first direction. As described above, the pair of string line groups S1 and S2 may be provided in plurality within the first region 80. Correspondingly, the driving transistor region 200 may be provided in plurality within the second region 85.

Continuously, referring to FIGS. 1, 2A, and 2B, at least one of interlayer dielectrics 115 and 120 may be disposed on an entire surface of the substrate 100. At least one of the interlayer dielectrics 115 and 120 within the first region 80 may cover the string line groups S1 and S2 and the extension parts SSLe, WLe, and GSLe. That is, at least one of the interlayer dielectrics 115 and 120 may be disposed on the string line groups S1 and S2 and the extension parts SSLe, WLe, and GSLe. At least one of the interlayer dielectrics 115 and 120 within the second region 85 may be disposed on the driving transistors within the driving transistor region 200.

For example, the first interlayer dielectric 115 may be disposed on the entire surface of the substrate 100. A common source line CSL may be disposed within the first interlayer dielectric 115 in the first region 80. The common source line CSL may be electrically connected to the string source region 110s. The common source line CSL may be disposed at a side of the ground select line GSL. The common source line CSL may extend in the first direction. That is, the common source line CSL may extend parallel to the ground select line GSL, the word lines WL, and the string select line SSL. Thus, the common source line CSL may be electrically connected to the plurality of string source regions 110s arranged along the first direction. A top surface of the common source line CSL may be coplanar with a top surface of the first interlayer dielectric 115. The second interlayer dielectric 120 may be disposed on the first interlayer dielectric 115 and the common source line CSL. The first interlayer dielectric 115 may include an oxide layer, a nitride layer, and/or an oxide nitride layer. The second interlayer dielectric 120 may include an oxide layer, a nitride layer, and/or an oxide nitride layer.

A plurality of bias interconnection groups may be disposed on the second interlayer dielectric 120 in the second region 85. The plurality of bias interconnection groups may be arranged in the second direction. The plurality of bias interconnection groups may include a pair of bias interconnection groups K1 and K2 adjacent to each other. The first bias interconnection group K1 of the pair of bias interconnection groups may include bias interconnections 150S, 150C, and 150G electrically and respectively connected to the lines SSL, WL, and GSL within the first string line group S1. Also, the second bias interconnection group K2 may include bias interconnections 150S, 150C, and 150G electrically and respectively connected to the lines SSL, WL, and GSL within the second string line group S2. The bias interconnection 150S electrically connected to the string select line SSL is defined as a string select bias interconnection 150S. The bias interconnection 150G electrically connected to the ground select line GSL is defined as a ground select bias interconnection 150G. The bias interconnection 150C electrically connected to the word line WL is defined as a cell bias interconnection 150C.

The respective bias interconnection groups K1 and K2 may include one ground select bias interconnection 150G, one string select bias interconnection 150S, and the plurality of cell bias interconnections 150C. The bias interconnections 150G, 150S, and 150C within the first bias interconnection group K1 are electrically connected to the second source/ drains (reference numeral 210 of FIG. 3) of the first driving transistors (reference symbol DTR1 of FIG. 3) within the driving transistor region 200, respectively. Similarly, the bias interconnections 150G, 150S, and 150C within the second bias interconnection group K2 are electrically connected to the second source/drains (reference numeral 220 of FIG. 3) of the second driving transistors (reference symbol DTR2) within the driving transistor region 200, respectively. That is, the bias interconnections 150G, 150S, and 150C electrically connect the driving transistors to the ground select, string select, and word lines GSL, SSL, and WL. According to an embodiment, the signal line 230 of FIG. 3 may be relatively higher than those of the bias interconnections 150G, 150S, and 150C.

As shown in FIG. 1, the bias interconnections 150G, 150S, and 150C may extend parallel to the first direction. As shown in FIG. 2A, the bias interconnections 150G, 150S, and 150C may be disposed on the substantially same level as each other with respect to the top surface of the substrate 100. The bias interconnections 150G, 150S, and 150C may be disposed at positions higher than those of the lines SSL, WL, and GSL within the string ling groups S1 and S2.

The string select bias interconnection 150S of the first bias interconnection group K1 is disposed between the group select bias interconnection 150G and the cell bias interconnections 150C within the first bias interconnection group K1. That is to say, the ground select bias interconnection 150G is sufficiently spaced from the cell bias interconnections 150C by the string select bias interconnection 150S between the ground select bias interconnection 150G and the cell bias interconnections 150C. Thus, an interference phenomenon between the ground select bias interconnection 150G and the cell bias interconnections 150C may be minimized.

The bias interconnections 150G, 150S, and 150C within the second bias interconnection group K2 may be mirror-symmetrically disposed with respect to the bias interconnections 150G, 150S, and 150C within the first bias interconnection group K1 in the second direction. That is to say, the first bias interconnection group K1 and the second bias interconnection group K2 may be symmetric to each other with respect to a virtual line passing between the first and second bias interconnection groups K1 and K2 and extending in the first direction. According to an embodiment, the ground select bias interconnection 150G among the bias interconnections 150G, 150S, and 150C within the first bias interconnection group K1 may be disposed most adjacent to the second bias interconnection group K2. Similarly, the ground select bias interconnection 150G among the bias interconnections 150G, 150S, and 150C within the second bias interconnection group K2 may be disposed most adjacent to the first bias interconnection group K1. Thus, the pair of ground select bias interconnections 150G respectively included in the pair bias interconnection groups K1 and K2 adjacent to each other may be disposed between the pair of string select bias interconnections 150S respectively included in the pair of bias interconnection groups K1 and K2.

As shown in FIG. 1, according to an embodiment, pick-up bias interconnections 151, 152, and 153 may be disposed between the pair of ground select bias interconnections 150G. As shown in FIG. 2A, the pick-up bias interconnections 151, 152, and 153 may be disposed on the substantially same level as the bias interconnections 150G, 150S, and 150C of the bias interconnection groups K1 and K2 with respect to the top surface of the substrate 100. The first pick-up bias interconnection 151 may be electrically connected to the deep well region 101 doped with the second type dopant, and the second pick-up bias interconnection 151 may be electrically connected to the substrate 100 doped with the first dopant. The third pick-up bias interconnection 153 may be electrically connected to the pocket well region 102 doped with the first type dopant. The first, second, and third pick-up bias interconnections 151, 152, and 153 may be electrically connected to the deep well region 101, the substrate 100, and the pocket well region 102 through pick-up contact plugs passing through the second and first interlayer dielectrics 120 and 115, respectively. According to an embodiment, the pick-up bias interconnections 151, 152, and 153 and the bias interconnections 150G, 150S, and 150C within the bias interconnection groups K1 and K2 may be disposed at the same interval therebetween.

The bias interconnections 150G, 150S, and 150C within the bias interconnection groups K1 and K2 may be formed of a metal (e.g., titanium, tantalum, tungsten, aluminum, copper, etc) and/or a conductive metal nitride (e.g., titanium nitride, tantalum nitride, etc). When the pick-up bias interconnections 151, 152, and 153 are disposed on the same level as those of the bias interconnections 150G, 150S, and 150C within the bias interconnection groups K1 and K2, the pick-up bias interconnections 151, 152, and 153 may be formed of the same conductive material as those of the bias interconnections 150G, 150S, and 150C within the bias interconnection groups K1 and K2.

The ground select, string select, and cell bias interconnections 150G, 150S, and 150C may include extension parts 150Ge, 150Se, and 150Ce laterally extending into the third region 90, respectively. According to an embodiment, the extension part 150Ge of the ground select bias interconnection 150G among the extension parts 150Ge, 150Se, and 150Ce may have the longest length, and the extension part 150Se of the string select bias interconnection 150S may have the shortest length. The respective extension parts 150Ce of the cell bias interconnections 150C may have a length gradually decreasing while moving away from the extension part 150Se of the string select bias interconnection 150S within each bias interconnection group K1 or K2. However, other embodiments are possible. The extension parts 150Ge, 150Se, and 150Ce of the bias interconnections 150G, 150S, and 150C may have various lengths, respectively.

The extension parts of the bias interconnections 150G, 150S, and 150C may partially overlap the extension parts GSLe, SSLe, and WLe of the ground select, string select, and word lines GSL, SSL, and WL, respectively. A contact plug 125 may be disposed in each of the overlapping regions, and thus, each of the bias interconnections 150G, 150S, and 150C may be electrically connected to each of the respective lines GSL, SSL, and WL. For example, as shown in FIG. 2B, the contact plug 125 passing through the second and first interlayer dielectrics 120 and 115 may be disposed between the extension part 150Ge of the ground select bias interconnection 150G and the extension part GSLe of the ground select line GSL, which overlap each other. A bottom surface of the contact plug 125 may contact the extension part GSLe of the ground select line GSL, and a top surface of the contact plug 125 may contact the extension part 150Ge of the ground select bias interconnection 150G.

Referring to FIGS. 1, 2A, and 2B, the bit lines BL may be disposed on the second interlayer dielectric 120 in the first region 80. As shown in FIG. 1, the bit lines BL may extend parallel to each other in the second direction. The bit lines BL may cross over the string select, word, and ground select lines SSL, WL, and GSL. As shown in FIG. 2A, each of the bit lines BL may be electrically connected to the string drain region 110$d$ through a bit line contact plug 123 passing through the second and third interlayer dielectrics 120 and 115. The bit lines BL may be formed of a metal (e.g., titanium, tantalum, tungsten, aluminum, copper, etc) and/or a conductive metal nitride (e.g., titanium nitride, tantalum nitride, etc).

According to an embodiment, the bias interconnections 150G, 150S, and 150C within the bias interconnection groups K1 and K2 may be disposed on the substantially same level as those of the bit lines BL from the top surface of the substrate 100. In this case, the bit lines BL may be formed of the same conductive material as those of the bias interconnections 150G, 150S, and 150C.

In the nonvolatile memory device according to the above-described embodiment, the ground select bias interconnection 150G is spaced from the cell bias interconnection 150C with the string select bias interconnection 150S between the ground select bias interconnection 150G and the cell bias interconnection 150C. Thus, an interference phenomenon between the ground select bias interconnection 150G and the cell bias interconnections 150C may be minimized to realize the nonvolatile memory device having superior reliability.

When the nonvolatile memory device operates, a voltage difference between a first operation bias supplied into the ground select bias interconnection 150G and a second operation bias supplied into the cell bias interconnection 150C may be large. For example, when a program of the nonvolatile memory device operates, a ground voltage may be applied to the ground select bias interconnection 150G, and a high program voltage (e.g., about 15 V to about 25 V) may be applied to the cell bias interconnection 150C. As described above, since the ground select bias interconnection 150G is spaced from the cell bias interconnection 150C with the string select bias interconnection 150S between the ground select bias interconnection 150G and the cell bias interconnection 150C, the interference phenomenon between the ground select bias interconnection 150G and the cell bias interconnections 150C may be minimized.

When the ground select bias interconnection is disposed adjacent to the cell bias interconnection, the operation voltage supplied into the call bias interconnection may be reduced due to the large voltage difference, or break down between the ground select bias interconnection and the cell bias interconnection may occur. As a result, program errors may occur to deteriorate the reliability of the nonvolatile memory device. Particularly, as a distance between the lines is reduced due to high integration, the reliability of the nonvolatile memory device may be further deteriorated.

However, since the string select bias interconnection 150S is disposed between the ground select bias interconnection 150G and the cell bias interconnections 150C, the interference phenomenon between the ground select bias interconnection 150G and the cell bias interconnections 150C may be minimized to realize the nonvolatile memory device having superior reliability. Also, line widths between the bias interconnections 150G, 150S, 150C, 151, 152, and 153 and/or distances between the bias interconnections 150G, 150S, 150C, 151, 152, and 153 may be scaled down to allow the nonvolatile memory device to be optimized for high integration.

When the program operates, a turn-on voltage for turning on the string select transistor may be applied to the string select bias interconnection 150S. Thus, a voltage difference between the string select bias interconnection 150S and the cell bias interconnection 150C may be reduced. Also, a turn-on voltage for turning on the non-selected cell transistors may be applied to the non-selected cell bias interconnections 150C of the cell bias interconnections 150C. Thus, a voltage difference between the cell bias interconnections 150C may be reduced.

An alternative arrangement than the embodiment illustrated in FIG. 1 is shown in FIG. 12. As shown in FIG. 12, bias interconnection 150S is interposed between bias interconnection 150G and bias interconnections 150C. As with both the FIG. 1 example and the FIG. 12 example, the bias interconnections may be disposed on the same level and the bias interconnection 150S may be immediately adjacent the nearest one of bias interconnections 150C, with no other line interposed therebetween.

While both of the above embodiments of FIG. 1 and FIG. 12 show the bias interconnections 150G, 150S and 150C at a level different from the string select groups S1 and S2, all or some of these bias interconnections may be formed at the same level as the string groups S1 and S2. For example, in the example of FIG. 1, bias interconnections 150S, 150C and a majority of 150G may be formed at the same level as string groups S1 and S2, avoiding the need to connect the bias interconnections 150S and 150C to the corresponding lines of the string groups with a contact connection. Bias interconnection 150G may include a portion at a different level to traverse the string select line SSL and word lines WL (e.g., in the Y direction), connecting the remaining portion of the bias interconnection 150G at a first contact hole and to the appropriate ground select line GSL at a second contact hole. As yet another alternative to FIG. 1, bias interconnection 150G may be formed at one level which is different from the level of the lines of string groups S1 and S2 and different to level(s) of one or both of bias interconnections 150S and 150C.

Similarly, in the example of FIG. 12, bias interconnections 150G, 150C and a majority of 150S may be formed at the same level as string groups S1 and S2. In this alternative to FIG. 12, bias interconnection 150S may include a portion at a different level to traverse word lines WL (e.g., in the Y direction), connecting the remaining portion of the bias interconnection 150S at a first contact hold and to the appropriate string select line SSL at a second contact hole. As yet another alternative to FIG. 12, bias interconnection 150S may be formed at one level which is different to the level of the lines of string groups S1 and S2, and different to the level(s) of one or both of bias interconnections 150G and 150C.

As described above, the bias interconnections 150G, 150S, and 150C within the bias interconnection groups K1 and K2 may be disposed on the same level as those of the bit lines BL. On the other hand, the bit lines BL and the bias interconnections 150G, 150S, and 150C may be disposed on levels different from each other. This will be described with reference to the accompany drawings.

Figure 4A:
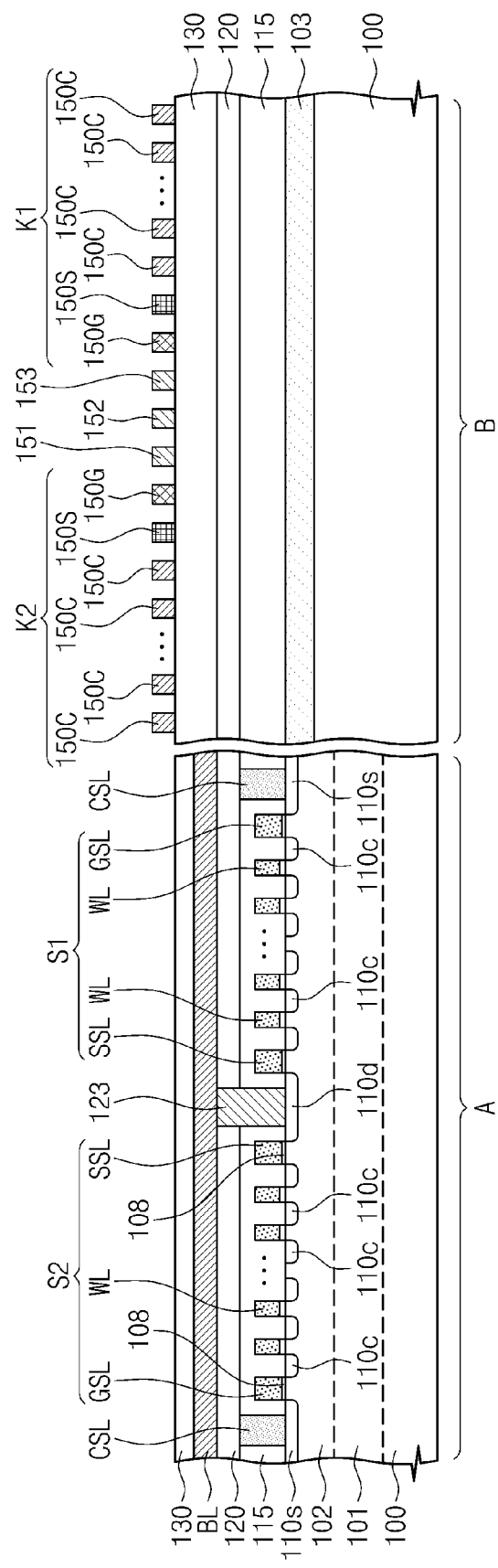
FIG. 4A is a sectional view taken along line I-I' and II-II' of FIG. 1 so as to explain a modified example of a nonvolatile memory device according to an embodiment.
Figure 4B:
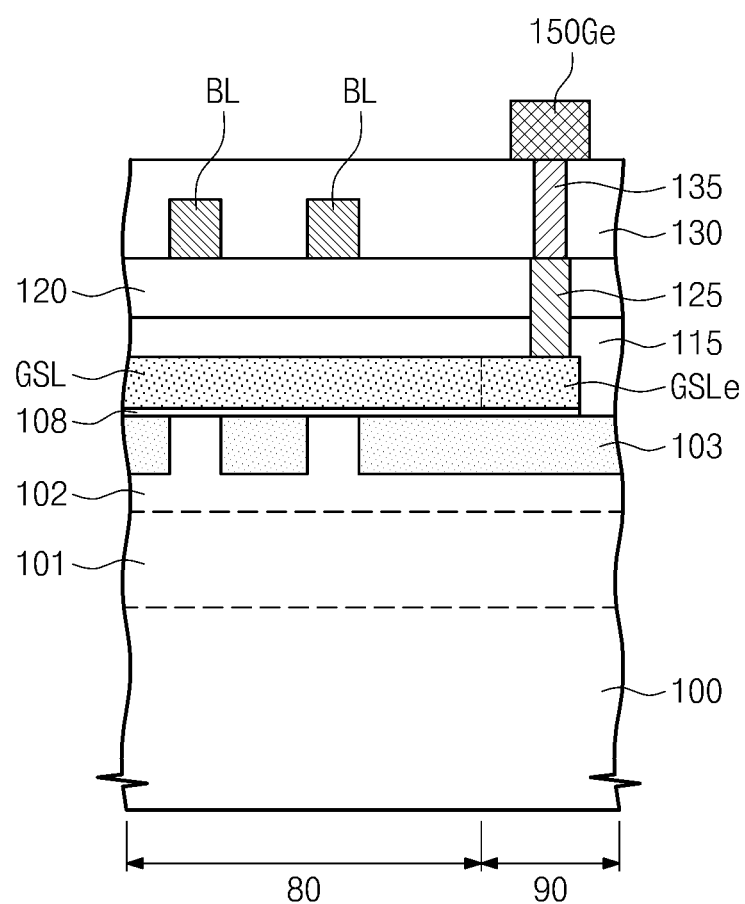
FIG. 4B is a sectional view taken along line III-III' of FIG. 1 so as to explain a modified example of a nonvolatile memory device according to an embodiment.

FIG. 4A is a sectional view taken along line I-I' and II-II' of FIG. 1 so as to explain a modified example of a nonvolatile memory device according to an embodiment, and FIG. 4B is a sectional view taken along line III-III' of FIG. 1 so as to explain a modified example of a nonvolatile memory device according to an embodiment.

Referring to FIGS. 4A and 4B, a third interlayer dielectric 130 may be disposed on bit lines BL and a second interlayer dielectric 120. Here, bias interconnections 150G, 150S, 150C, 151, 152, and 153 may be disposed on the third interlayer dielectric 130. That is to say, the bias interconnections 150G, 150S, 150C, 151, 152, and 153 may be disposed at positions higher than those of the bit lines BL with respect to a top surface of a substrate 100.

In this case, as shown in FIG. 4B, stacked first and second contact plugs 125 and 135 may be disposed between an extension part 150Ge of a ground select bias interconnection and an extension part GSLe of a ground select line. The first contact plug 125 may pass through the second and first interlayer dielectrics 120 and 115 to contact the extension part GSLe of the ground select line. Also, the second contact plug 135 may pass through the third interlayer dielectric 130 and may be disposed on the first contact plug 125. A top surface of the second contact plug 135 may contact the extension part 150Ge of the ground select bias interconnection. A bottom surface of the second contact plug 135 may have a width less than that of a top surface of the first contact plug 125. However, other embodiments are possible. For example, the first contact plug 125 may be omitted, and the second contact plug 135 may sequentially pass through the third, second, and first interlayer dielectrics 130, 120, and 115.

According to the modified example, the bias interconnections 150G, 150S, 150C, 151, 152, and 153 may be disposed at positions higher than those of the bit lines BL. However, other embodiments are possible. According to an embodiment, the bit lines BL may be disposed at positions higher than those of the bias interconnections 150G, 150S, 150C, 151, 152, and 153. In this case, the bit lines BL may be disposed on the third interlayer dielectric 130, and the bias interconnections 150OG, 150S, 150C, 151, 152, and 153 may be disposed between the third interlayer dielectric 130 and the second interlayer dielectric 120. In this case, a two-layered contact structure between the extension parts 150Ge and GSLe illustrated in FIG. 4B may be applied between the bit lines BL and string drain region 110d.

Next, a method of forming a nonvolatile memory device according to an embodiment will be described with reference to the accompanying drawings.

Figure 5A:
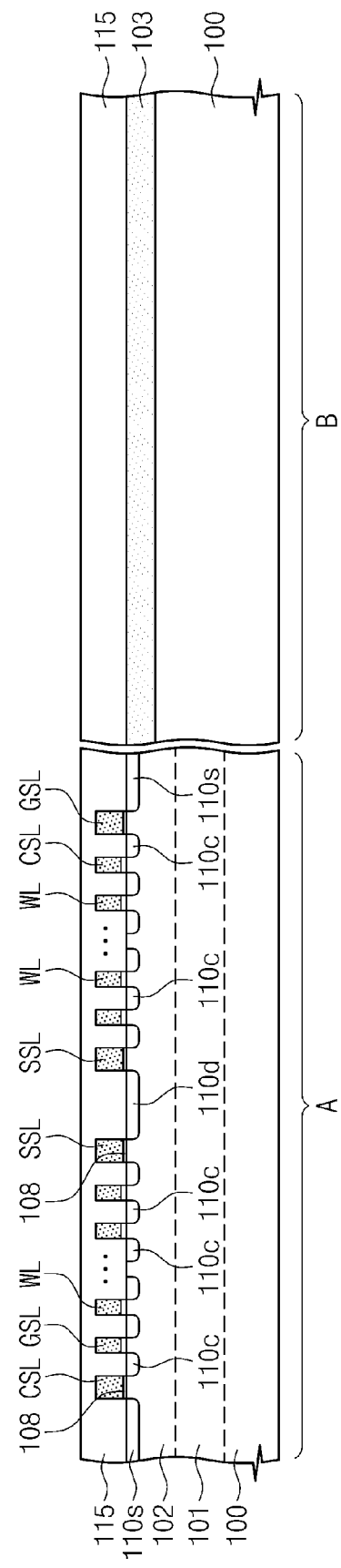
Figure 5B:
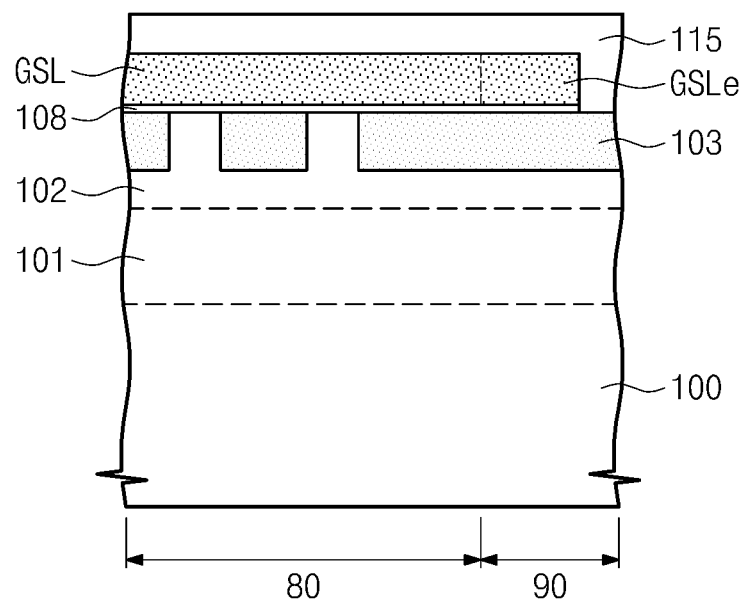
FIGS. 5B and 6B are sectional views taken along line III-III' of FIG. 1 so as to explain a method of forming a nonvolatile memory device according to an embodiment.
Figure 6B:
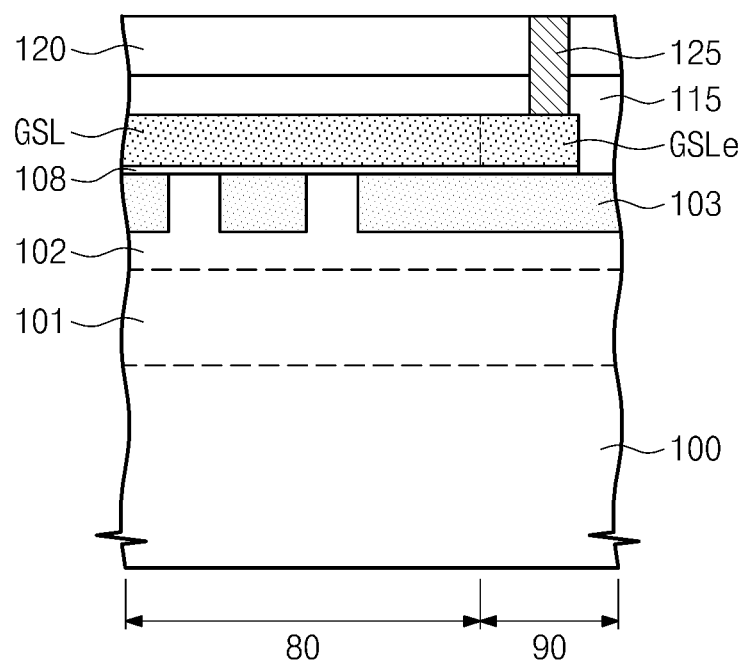

FIGS. 5A and 6A are sectional views taken along line I-I' and II-II' of FIG. 1 so as to explain a method of forming a nonvolatile memory device according to an embodiment, and FIGS. 5B and 6B are sectional views taken along line III-III' of FIG. 1 so as to explain a method of forming a nonvolatile memory device according to an embodiment.

Referring to FIGS. 1, 5A, and 5B, a second type dopant may be doped into a substrate 100 doped with a first type dopant to form a deep well region 101. Sequentially, the first type dopant may be doped into the deep well region 101 to form a pocket well region 102. A device isolation pattern 103 may be formed on the substrate 100 to define string active regions in a first region 80. According to an embodiment, after the deep well region 101 and the pocket well region 102 are formed, the device isolation pattern 103 may be formed. On the other hand, after the device isolation pattern 103 is formed, the deep well region 101 and the pocket well region 102 may be formed.

A ground select line GSL, word lines WL, and string select line SSL may be formed in the first region 80 of the substrate 100. The second type dopant may be injected using the ground select, word, and string select lines GSL, WL, and SSL as a mask to form a string source region 110s, a string drain region 110d, and a cell source/drain 110c.

According to an embodiment, before the second type dopant is injected, an ion injection mask pattern (not shown) covering the word lines WL may be formed. Here, regions in which the string source and drain regions 110s and 110d are formed may not be covered by the ion injection mask pattern. The second type dopant may be injected using the ion injection mask pattern to form the string source and drain regions 110s and 110d. In this case, the second type dopant is not injected into a region in which the cell source/drain 110c is defined. Also, the cell source/drain 110c may be defined as an inversion layer generated by an operation voltage supplied into the word lines WL. Sequentially, a first interlayer dielectric 115 may be formed on an entire surface of the substrate 100. Although not shown, before the first interlayer dielectric 115 is formed, driving transistors described with reference to FIG. 3 may be formed in a second region 85. Gates of the driving transistors may be formed simultaneously with the ground select, word, and string select lines GSL, WL, and GSL.

Referring to FIGS. 1, 6A, and 6B, a common source line CSL passing through the first interlayer dielectric 115 in the first region 80 and electrically connected to the string source region 110s may be formed. Sequentially, a second interlayer dielectric 120 may be formed on the entire surface of the substrate 100. The second interlayer dielectric 120 covers the common source line CSL.

A bit line contact plug 123 sequentially passing through the second and first interlayer dielectrics 120 and 115 within the first region 80 and connected to the string drain region 110d may be formed. Contact plugs 125 sequentially passing through the second and first interlayer dielectrics 120 and 115 within the third region 90 to respectively contact extension parts GSLe, WLe, SSLe of the ground select, word, and string select lines GSL, WL, and SSL may be formed. The contact plug 125 and the bit line contact plug 123 may be formed at the same time. The contact plug 125 and the bit line contact plug 123 maybe formed of at least one of doped group 4A elements (or doped group 14 elements), conductive metal nitrides (e.g., titanium nitride, tantalum nitride, etc), metals (e.g., titanium, tantalum, tungsten, etc), metal-group 4A (group 14) element compounds (e.g., tungsten silicide, cobalt silicide, etc).

Sequentially, bit lines BL and bias interconnections 150OG, 150S, 150C, 151, 152, and 153, which are described with reference to FIGS. 1, 2A, and 2B may be formed. The bit lines BL and the bias interconnections 150OG, 150S, 150C, 151, 152, and 153 may be formed at the same time. Thus, the nonvolatile memory device described with reference to FIGS. 1, 2A, and 2B may be realized.

A method of forming the nonvolatile memory device described with reference to FIGS. 4A and 4B will be described with reference to the accompanying drawings. This method may include the methods described with reference to FIGS. 5A, 5B, 6A, and 6B.

Figure 7A:
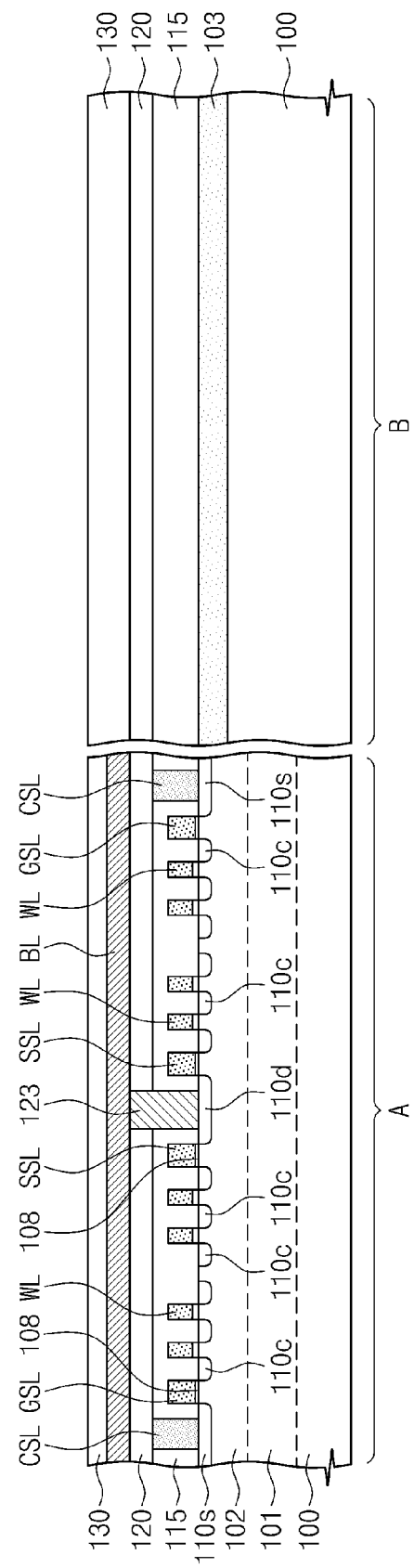
FIG. 7A is a sectional view taken along line I-I' and II-II' of FIG. 1 so as to explain a method of forming a modified nonvolatile memory device according to an embodiment.
Figure 7B:
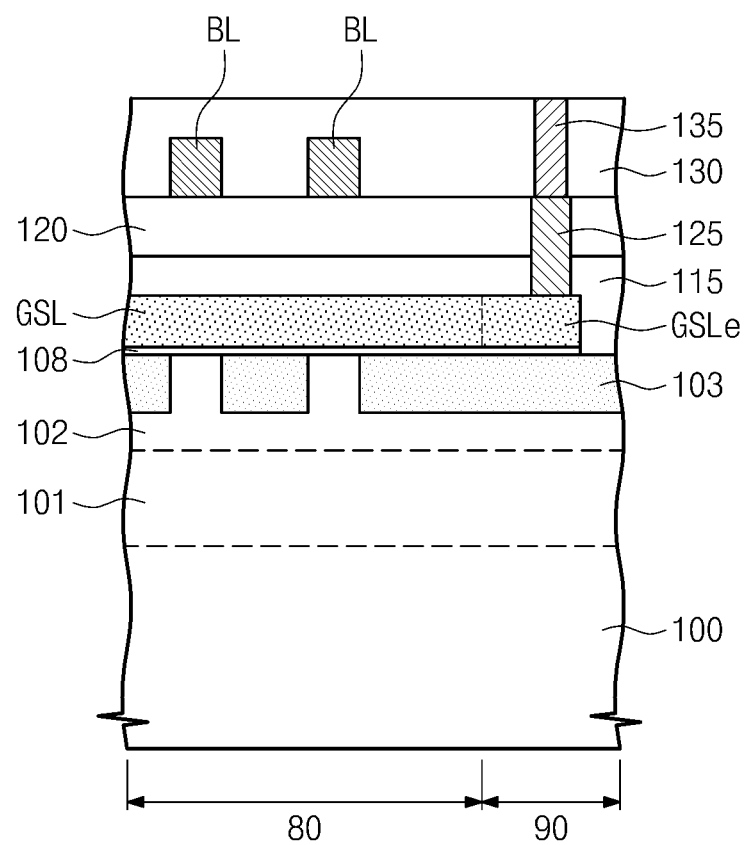
FIG. 7B is a sectional view taken along line III-III' of FIG. 1 so as to explain a method of forming a modified nonvolatile memory device according to an embodiment.

FIG. 7A is a sectional view taken along line I-I' and II-II' of FIG. 1 so as to explain a method of forming a modified nonvolatile memory device according to an embodiment, and FIG. 7B is a sectional view taken along line III-III' of FIG. 1 so as to explain a method of forming a modified nonvolatile memory device according to an embodiment.

Referring to FIGS. 6A, 6B, 7A, and 7B, the bit line BL is formed. Here, the bias interconnections 150OG, 150S, 150C, 151, 152, and 153 may not be formed. Sequentially, a third interlayer dielectric 130 may be formed on the entire surface of the substrate 100. A second contact plug 135 passing through the third interlayer dielectric 130 in the third region 90 may be formed. The second contact plug 135 may be formed on the contact plug 125. According to an embodiment, the formation process of the contact plug 125 may be omitted. In this case, the second contact plug 135 may be formed by sequentially passing through the third, second, and first interlayer dielectrics 130, 120, and 115.

Sequentially, the bias interconnections 150OG, 150S, 150C, 151, 152, and 153 illustrated in FIGS. 4A and 4B may be formed on the third interlayer dielectric 130 in the second region 85. Thus, the nonvolatile memory device described with reference to FIGS. 4A and 4B may be realized.

Second Embodiment

In the present embodiment, the same component as that of the above-described first embodiment will be denoted by the same reference numeral, and the description thereof will be omitted.

Figure 8:
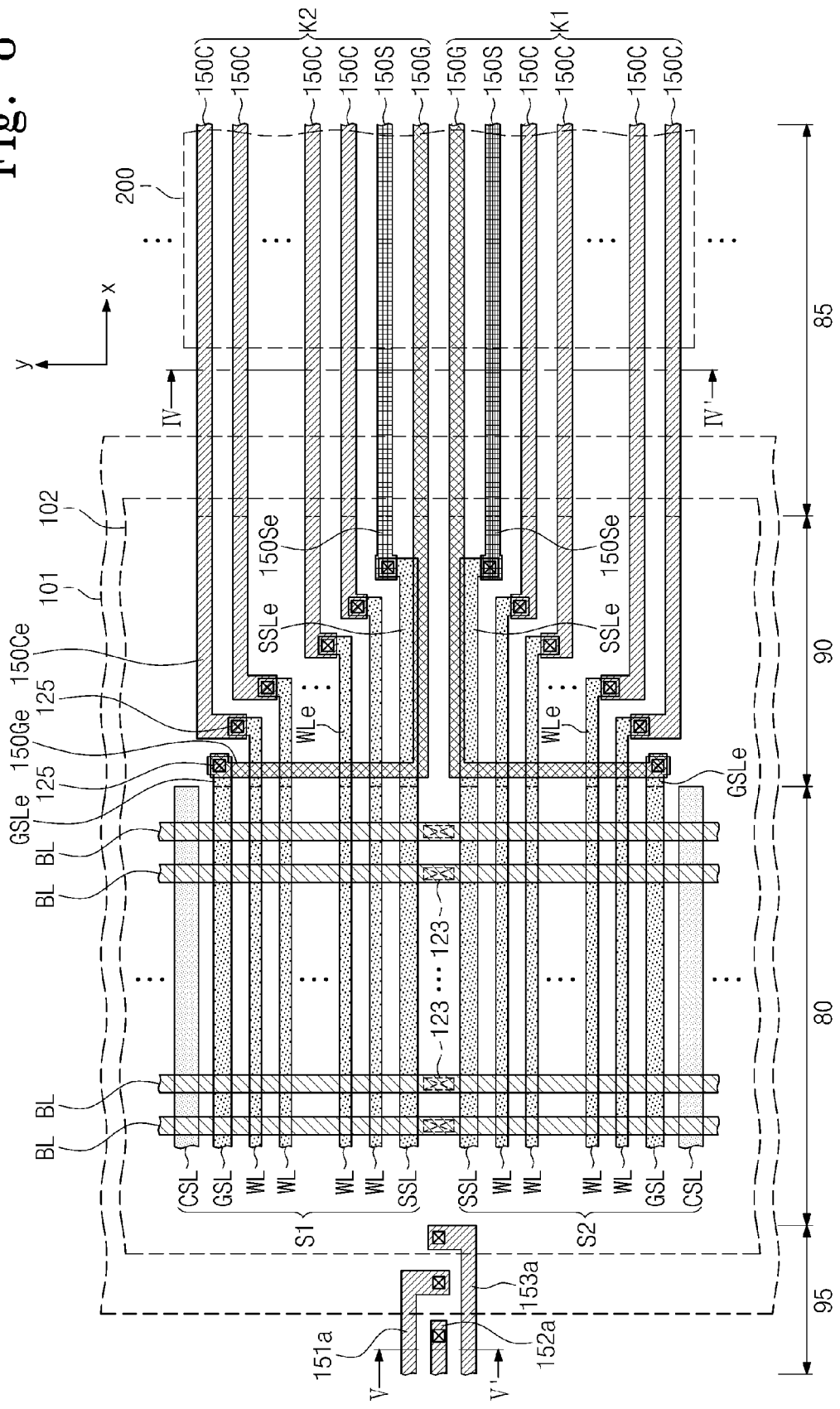
FIG. 8 is a plan view of a nonvolatile memory device according to another embodiment.
Figure 9:
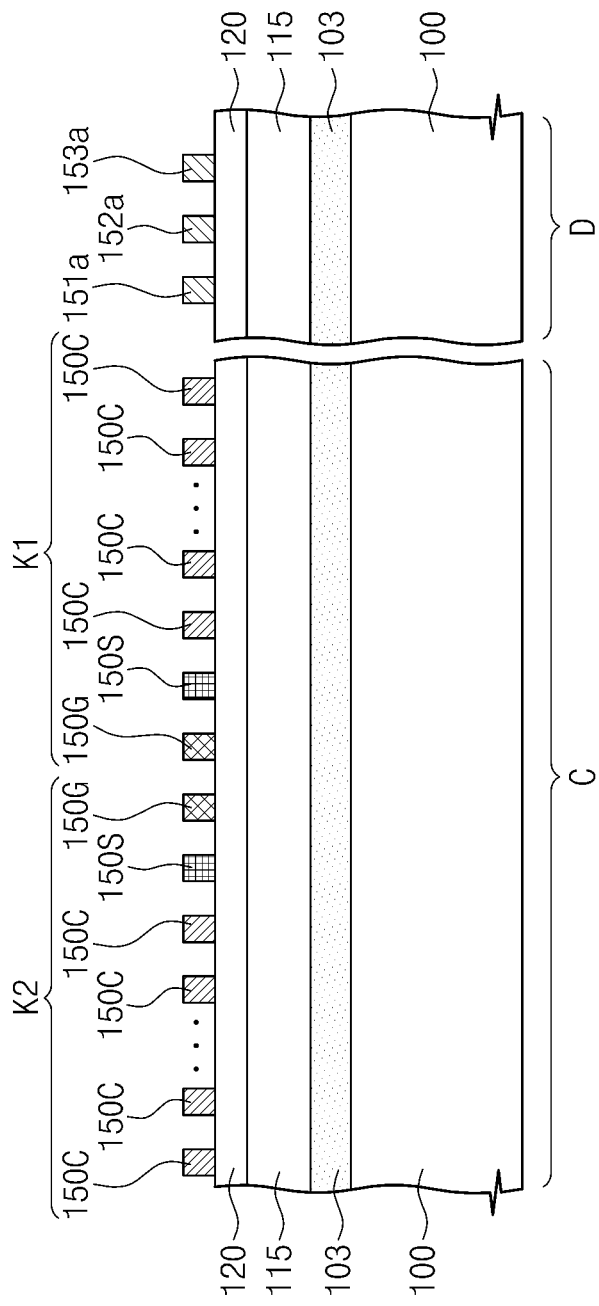
FIG. 9 is a sectional view taken along line IV-IV' and V-V' of FIG. 8.

FIG. 8 is a plan view of a nonvolatile memory device according to another embodiment, and FIG. 9 is a sectional view taken along line IV-IV' and V-V' of FIG. 8. A reference symbol C of FIG. 9 represents a sectional view taken along line IV-IV' of FIG. 8, and a reference symbol D represents a sectional view taken along line V-V' of FIG. 8.

Referring to FIGS. 8 and 9, a substrate 100 may include a first region 80, a second region 85, a third region 90, and a fourth region 95. The fourth region 95 may be a portion of a peripheral circuit region. The fourth region 95 may be disposed at a side of the first region 80 opposite to the third region 90. The first region 80 may be defined between the fourth region 95 and the third region 90. However, other embodiments are possible. The fourth region 95 may be disposed at a position that is adjacent to the first region and does not overlap the second region 85.

Pick-up bias interconnections 151a, 152a, and 153a may be disposed within the fourth region 95. A deep well region 101 and a pocket well region 102 may extend into the fourth region 95. The first, second, and third pick-up bias interconnections 151a, 152a, and 153a may be disposed on a second interlayer dielectric 120 within the fourth region 95. The first pick-up bias interconnection 151a may be electrically connected to the deep well region 101. The second pick-up bias interconnection 152a may be electrically connected to the substrate 100. The third pick-up bias interconnection 153a may be electrically connected to the pocket well region 102. As shown in FIG. 9, the first, second, and third pick-up bias interconnections 151a, 152a, and 153a may be disposed on the same level as each other from the substrate 100. However, other embodiments are possible. The first, second, and third pick-up bias interconnections 151a, 152a, and 153a may be disposed at positions having heights different from each other.

In the second region 85, other lines may not be disposed between a pair of ground select bias interconnections GSL respectively included in a pair of bias interconnection groups K1 and K2 adjacent to each other. For example, the pick-up bias interconnections 151a, 152a, and 153a may be disposed in the fourth region 95, and other lines may not be disposed between the pair of ground select bias interconnections GSL. That is, the bias interconnections most adjacent to both sides of the ground select bias interconnection 150G within the first bias interconnection group K1 may be a string select bias interconnection 150S within the first bias interconnection group K1 and the ground select bias interconnection 150G within the second bias interconnection group K2.

According to an embodiment, the bias interconnections 150G, 150S, and 150C within the first and second bias interconnection groups K1 and K2 may be disposed at the same interval therebetween in the second region 85.

As shown in FIG. 9, the pick-up bias interconnections 151a, 152a, and 153a may be disposed on the same level as those of the bias interconnections 150G, 150S, and 150C within the bias interconnection groups K1 and K2. However, other embodiments are possible. The pick-up bias interconnections 151a, 152a, and 153a may be disposed on levels different from those of the bias interconnections 150G, 150S, and 150C within the bias interconnection groups K1 and K2.

Like the first embodiment described above, the bias interconnections 150G, 150S, and 150C within the bias interconnection groups K1 and K2 may be disposed on the same level as those of bit lines BL or levels different from those of the bit lines BL.

The nonvolatile memory devices disclosed in the above-described embodiments may be realized as various types of semiconductor packages. For example, the nonvolatile memory devices according to the embodiments may be packaged into various types such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The package in which the nonvolatile memory device according to the embodiments is mounted may further include a controller and/or a logic device that control the nonvolatile memory device.

Figure 10:
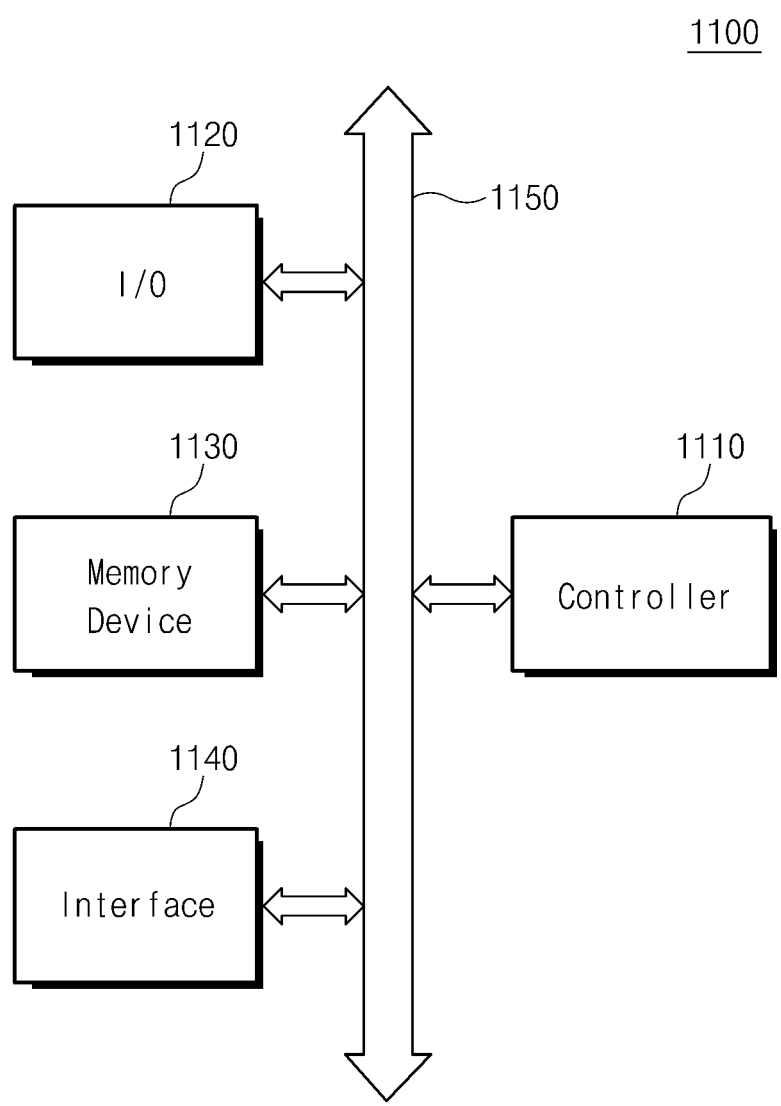
FIG. 10 is a block diagram illustrating an example of an electronic system including a nonvolatile memory device.

FIG. 10 is a block diagram illustrating an example of an electronic system including a nonvolatile memory device.

Referring to FIG. 10, an electronic system 1100 according to an embodiment, may include a controller 1110, an input/output (I/O) unit 1120, a memory device 1130, an interface 1140, and a bus 1150. The controller 1110, the I/O unit 1120, the memory device 1130, and/or the interface 1140 may be coupled to each other through the bus 1150. The bus 1150 may serve as a path through which data are delivered.

The controller 1110 may include at least one of a micro processor, a digital signal processor, a micro controller, and logic devices which are capable of performing similar functions thereto. The I/O unit 1120 may include a keypad, a keyboard, and a display device. The memory device 1130 may store data and/or commands. The memory device 1130 may include at least one of the nonvolatile memory devices according to the above-described embodiments. Also, the memory device 1130 may further include a semiconductor memory device (e.g., DRAM device and/or SRAM device). The interface 1140 may transmit data to a communication network or receive data from the communication network. The interface 1140 may be a wired interface or a wireless interface. For example, the interface 1140 may include an antenna or a wired/wireless transceiver. Although not shown, the electronic system 1100 may be an operation memory device for improving an operation characteristic of the controller 1110, and may further include a high-speed DRAM device and/or SRAM device.

The electronic system 1100 may be applicable to a personal digital assistant (PDA), a portable computer, a web tablet, a wireless phone, a mobile phone, a digital music player, a memory card, or all electronic products capable of transmitting/receiving information in wireless environments.

Figure 11:
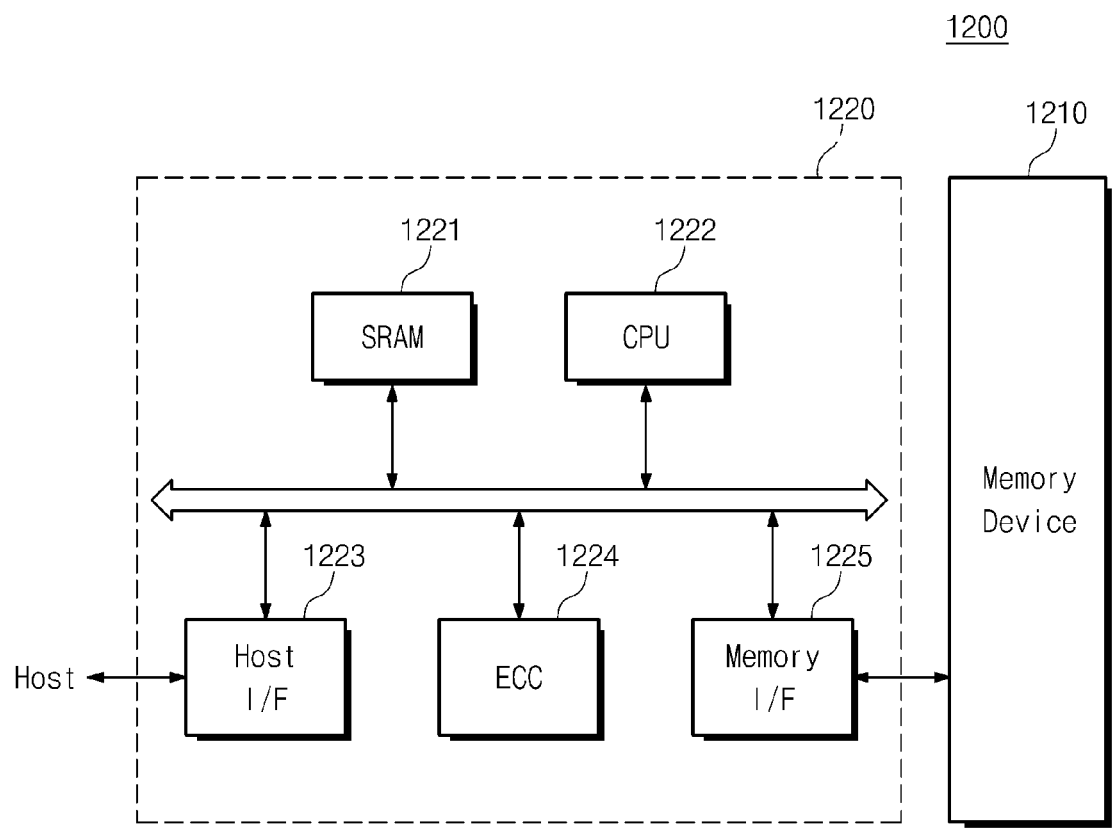
FIG. 11 is a block diagram illustrating an example of a memory card including a nonvolatile memory device.

FIG. 11 is a block diagram illustrating an example of a memory card including a nonvolatile memory device.

Referring to FIG. 11, a memory card 1200 according to an embodiment includes a memory device 1210. The memory device 1210 may include at least one of the nonvolatile memory devices according to the above-described embodiments. Also, the memory device 1210 may include different types of semiconductor memory devices (e.g., DRAM device and/or SRAM device). The memory card 1200 may include a memory controller 1220 configured to control data exchanges between a host and the memory device 1210.

The memory controller 1220 may include a processing unit 1222 that controls an overall operation of the memory card. Also, the memory controller 1220 may include an SRAM 1221 used as an operation memory of the processing unit 1222. Furthermore, the memory controller 1220 may further include a host interface 1223 and a memory interface 1225. The host interface 1223 includes a protocol for performing data exchange between the memory card 1200 and the host. The memory interface 1225 may connect the memory controller 1220 to the memory device 1210. Furthermore, the memory controller 1220 may further include an error correction block (ECC) 1224. The ECC 1224 may detect and correct errors of data read from the memory device 1210. Although not shown, the memory card 1200 may include a ROM device that stores code data for interfacing with the host. The memory card 1200 may be used as a portable data storage card. On the other hand, the memory card 1200 may be realized as a solid state disk (SSD) capable of replacing a hard disk of a computer system.

According to an embodiment, the string select bias interconnection is disposed between the ground select bias interconnection and the cell bias interconnection within the bias interconnection group. Thus, the ground select bias interconnection can be sufficiently spaced from the cell bias interconnections by the string select bias interconnection between the ground select bias interconnection and the cell bias interconnection. Therefore, the interference phenomenon between the ground select bias interconnection and the cell bias interconnection may be minimized to realize the nonvolatile memory device having superior reliability. Also, the line widths between the bias interconnections and/or the distances between the bias interconnections may be scaled down to realize the nonvolatile memory device optimized for high integration.

The above-disclosed subject matter is to be considered illustrative and not restrictive, and the appended claims are intended to cover all such modifications, enhancements, and other embodiments, which fall within the true spirit and scope of the invention set forth in the appended claims. Thus, to the maximum extent allowed by law, the scope of the invention is to be determined by the broadest permissible interpretation of the following claims and their equivalents, and shall not be restricted or limited by the foregoing detailed description.

What is claimed is:

1. A nonvolatile memory device, comprising:
   a substrate comprising a first region and a second region, which are spaced from each other;
   a string line group disposed above the substrate in the first region, the string line group comprising a string select line, word lines, and a ground select line; and
   a bias interconnection group disposed above the substrate in the second region, the bias interconnection group comprising a string select bias interconnection, cell bias interconnections, and a ground select bias interconnection, which are respectively electrically connected to the string select line, the word lines, and the ground select line in the string line group,
   wherein the string select bias interconnection is disposed between the ground select bias interconnection and the cell bias interconnections of the bias interconnection group.

2. The nonvolatile memory device of claim 1, wherein the bias interconnections of the bias interconnection group are disposed at positions higher than those of the lines of the string line group relative to a top surface of the substrate.

3. The nonvolatile memory device of claim 1, wherein the ground select, string select, and cell bias interconnections are disposed on the same level as each other relative to a top surface of the substrate.

4. The nonvolatile memory device of claim 1,
   wherein the string select bias interconnection, the cell bias interconnections and the ground select bias interconnection extend parallel to each other in a first direction parallel to a top surface of the substrate, and
   wherein the string select line, the word lines, and the ground select line extend parallel to each other in the first direction.

5. The nonvolatile memory device of claim 4, wherein the word lines are disposed between the string select line and the ground select line of the string line group.

6. The nonvolatile memory device of claim 4, wherein the ground select bias interconnection, the string select bias interconnection, and the cell bias interconnections are disposed with the same interval therebetween.

7. The nonvolatile memory device of claim 4, further comprising:
   at least one interlayer dielectric covering the lines of the string line group, the at least one interlayer dielectric being disposed on substantially an entire surface of the substrate; and
   bit lines disposed on the interlayer dielectric in the first region, the bit lines extending parallel to each other in a second direction perpendicular to the first direction.

8. The nonvolatile memory device of claim 7, wherein the ground select, string select, and cell bias interconnections are disposed on the same level as those of the bit lines relative to the top surface of the substrate.

9. The nonvolatile memory device of claim 7, wherein the ground select, string select, and cell bias interconnections are disposed on levels different from those of the bit lines from the top surface of the substrate.

10. The nonvolatile memory device of claim 7, further comprising:
    a string source region defined in the substrate at a side of the ground select line;
    a common source line connected to the string source region, the common source line extending in the first direction; and
    a string drain region defined in the substrate at a side of the string select line,
    wherein the at least one interlayer dielectric comprises a first interlayer dielectric and a second interlayer dielectric, and the second interlayer dielectric covers a top surface of the common source line, and
    wherein the bit line is disposed on the second interlayer dielectric and electrically connected to the string drain region by a contact plug sequentially passing through the second and first interlayer dielectrics.

11. The nonvolatile memory device of claim 1,
    wherein the substrate further comprises a third region defined between the first region and the second region,
    wherein each of the lines of the string line group comprises an extension part extending into the third region,
    wherein each of the bias interconnections of the bias interconnection group comprises an extension part extending into the third region,
    wherein the extension parts of the lines of the string line group and the bias interconnections of the bias interconnection group, which are electrically connected to each other, partially overlap each other, and
    wherein the overlapping extension parts are electrically connected to each other by a contact plug disposed therebetween.

12. The nonvolatile memory device of claim 1,
    wherein the string line group is provided in plurality within the first region,
    wherein the bias interconnection group is provided in plurality within the second region,
    wherein the ground select bias interconnection, the string select bias interconnection, and the cell bias interconnections extend parallel to each other in a first direction, wherein the string select line, the word line, and the ground select line extend parallel to each other in the first direction, wherein the string line groups are mirror-symmetrically arranged in a second direction perpendicular to the first direction, and wherein the bias interconnection groups are mirror-symmetrically arranged in the second direction.

13. The nonvolatile memory device of claim 12, wherein the plurality of bias interconnection groups comprises a pair of bias interconnection groups adjacent to each other, and wherein a pair of ground select bias interconnections respectively included in the pair of bias interconnection groups are disposed between a pair of string select bias interconnections respectively included in the pair of bias interconnection group.

14. The nonvolatile memory device of claim 13, further comprising:
  a deep well region formed in the first region of the substrate;
  a pocket well region formed in the deep well region;
  a first pick-up bias interconnection disposed between the pair of ground select bias interconnections, the first pick-up bias interconnection being electrically connected to the deep well region;
  a second pick-up bias interconnection disposed between the pair of ground select bias interconnections, the second pick-up line being electrically connected to the pocket well region; and
  a third pick-up bias interconnection disposed between the pair of ground select bias interconnections, the third pick-up line being electrically connected to the substrate.

15. The nonvolatile memory device of claim 14, wherein the first, second, and third pick-up bias interconnections are disposed on the same level as those of the bias interconnections of the pair of bias interconnection groups, and wherein the first, second, and third pick-up bias interconnections and the bias interconnections of the pair of bias interconnection groups are disposed with the same interval therebetween.

16. The nonvolatile memory device of claim 13, wherein the bias interconnections of the pair of bias interconnection groups are disposed with the same interval therebetween.

17. A NAND flash memory device, comprising:
  a decoder;
  an active region;
  a plurality of cell strings formed at the active region, each cell string including a string select transistor, a ground select transistor and a plurality of serially connected memory transistor cells interposed between the string select transistor and the ground select transistor;
  a string line group extending in the same direction across the plurality of cell strings, comprising:
    a ground select line electrically connected to control nodes of respective ground select transistors of the plurality of cell strings;
    a string select line electrically connected to control nodes of respective string select transistors of the plurality of cell strings;
    a plurality of word lines interposed between the ground select line and the string select line, each word line electrically connected to control nodes of respective memory transistor cells of the plurality of cell strings;
  an interconnection line group extending in the same direction from the decoder to the string line group, the interconnection line group comprising:
    a first line electrically connecting the ground select line to a first output of the decoder;
    a second line electrically connecting the string select line to a second output of the decoder; and
    a group of third lines, each third line electrically connecting a respective word line to a respective third output of the decoder;
  wherein the second line is interposed between the first line and the group of third lines.

18. The NAND flash memory device of claim 17, further comprising:
  an isolation region interposed between the decoder and the active region,
  wherein the interconnection line group extends over the isolation region.

19. The NAND flash memory device of claim 17, wherein the decoder is a row decoder responsive to address signals for activating a word line of the plurality of word lines.

20. A nonvolatile memory device, comprising:
  a substrate;
  a cell string including a string select transistor, a ground select transistor and a plurality of serially connected memory transistor cells interposed between the string select transistor and the ground select transistor
  a bias interconnection group disposed above the substrate, the bias interconnection group comprising a string select bias interconnection electrically connected to the string select transistor, cell bias interconnections electrically connected to the memory transistor cells, and a ground select bias interconnection electrically connected to the ground select transistor,
  wherein the string select bias interconnection is disposed between the ground select bias interconnection and the cell bias interconnections within of the bias interconnection group.

* * * * *